United States Patent [19]

Kalejs et al.

[11] 4,430,305
[45] Feb. 7, 1984

[54] DISPLACED CAPILLARY DIES

[75] Inventors: Juris P. Kalejs, Wellesley; Bruce Chalmers, Falmouth, both of Mass.; Thomas Surek, Englewood, Colo.

[73] Assignee: Mobil Solar Energy Corporation, Waltham, Mass.

[21] Appl. No.: 11,527

[22] Filed: Feb. 12, 1979

[51] Int. Cl.$^3$ .............................................. C30B 15/34
[52] U.S. Cl. .............................. 422/246; 156/DIG. 83
[58] Field of Search ........ 422/246; 156/608, DIG. 64, 156/DIG. 83, DIG. 88

[56] References Cited

U.S. PATENT DOCUMENTS

| 4,022,652 | 5/1977 | Hirano et al. | 156/608 |
| 4,099,924 | 7/1978 | Berkman et al. | 156/DIG. 83 |
| 4,116,641 | 9/1978 | Ciszek | 422/246 |

FOREIGN PATENT DOCUMENTS

| 2704913 | 7/1978 | Fed. Rep. of Germany | 156/608 |
| 53-55483 | 5/1978 | Japan . | |
| 53-55484 | 5/1978 | Japan . | |

OTHER PUBLICATIONS

Jl. of Electronic Materials, vol. 4, No. 2, 1975, Swartz et al., 255–279.
Jl. of Crystal Growth, vol. 39, No. 1, Jul. '77, Ravi-16.
Jl. of Crystal Growth, vol. 42, Dec. 77, Surek et al., 453–465.

Primary Examiner—Hiram H. Bernstein
Attorney, Agent, or Firm—Schiller & Pandiscio

[57] ABSTRACT

An asymmetrical shaped capillary die made exclusively of graphite is used to grow silicon ribbon which is capable of being made into solar cells that are more efficient than cells produced from ribbon made using a symmetrically shaped die.

9 Claims, 4 Drawing Figures

DISPLACED CAPILLARY DIES

The Government has rights in this invention pursuant to Contract No. NAS7-100, JPL Subcontract 954355 awarded by the U.S. Department of Energy.

This invention relates to growth of crystals from a melt and more particularly to the drawing of elongate crystalline bodies from a melt of a material such as silicon, germanium, sapphire or the like.

Growth of crystalline bodies with diverse cross-sectional shapes can be grown with excellent dimensional control over long lengths by means of a capillary die according to the "Edge-defined, Film-fed Growth" (EFG) technique which is exemplified and described in varying detail in U.S. Pat. Nos. 3,591,348, 3,687,633 and 3,953,174. In the EFG method, a wettable capillary die conducts the melt from a reservoir supply (usually contained in a crucible) to the growing crystal interface just above the top of the die, with the shape of the resultant crystalline body being determined by the shape of the growth meniscus which in turn is controlled by the perimeter of the die top. Application of the EFG process to silicon in relation to fabrication of solar cells is described by J. C. Swartz, T. Surek and B. Chalmers in "The EFG Process Applied to the Growth of Silicon Ribbons", J. Elec. Mat., Vol. 4, No. 2, pp. 255-279, 1975; by K. V. Ravi in "The Growth of EFG Silicon Ribbons", J. Crystal Growth, Vol. 39, pp. 1-16, July 1977; and by T. Surek et al, "The Edge-Defined Film-Fed Growth of Controlled Shape Crystals," J. Crystal Growth Vol. 42, pp. 453-465, December 1977.

An important consideration in the attainment of shaped crystal growth by EFG is the design of the capillary die. First of all the die must be made of a material that is wettable by the melt since wettability affects capillary rise and edge-definition for shaped growth. Secondly, since the shape of the crystal is governed by the edge configuration of the upper end of the die, the outside dimensions of the die have to be appropriately designed. Thirdly the die must be made of a material which has mechanical integrity and is chemically compatible with the melt. Fourthly the die must be designed with a concern for thermal considerations since the ability to establish a crystallization front of suitable configuration determines the reliability of crystal growth. The thermal properties of the die and the details of die design can be used to control the meniscus shape and height and also the shape of the crystal-liquid interface. This is important from the point of view of crystallinity and the solute distribution in the grown crystal. Thus, as noted by Ravi, supra, the dies may terminate at their upper ends in "flats" or "knife-edges" according to the desired overall thickness of the grown bodies, and the upper end of the die may have a horizontal channel extending side-to-side for facilitating flow of the melt from the vertical capillary passageway(s) to the meniscus film on top of the die. By appropriately arranging the capillaries and feeding channels it is possible to achieve solute redistribution by the flow of melt at the top of the die and in the meniscus film on top of the die.

The growth of shaped silicon products by EFG for use in making solar cells is complicated by the necessity that the die and crucible materials be pure and not introduce any harmful impurities into the melt and growing crystal, and also by the fact that molten silicon reacts with and/or dissolves most substances that may be likely candidates as die materials. Since a degree of reactivity between molten silicon and the die is unavoidable, it is desirable that the reaction product(s) be electrically neutral in the silicon crystal or (if insoluble in silicon) be structurally compatible in order not to generate an excessive density of crystallographic defects which would lead to excessive poly crystallinity.

For silicon ribbon growth, fused quartz, silicon nitride ($Si_3N_4$), silicon carbide (SiC) and graphite have been considered most seriously as possible die materials. Fused quartz has been rejected since it is barely wetted by liquid silicon. Silicon nitride is unacceptable since it tends to react too rapidly with molten silicon. Silicon carbide is wetted by silicon and has adequate strength at the melting point of silicon, but the difficulty of machining SiC per se makes it unacceptable in the case of capillary dies for growing relatively thin ribbons, i.e., ribbons with a thickness of 0.006-0.020 inch. Also silicon carbide in form suitable for making capillary dies is not available in adequate purity.

Because the limitations of the foregoing materials, current EFG technology is based upon graphite dies since graphite has adequate strength at the melting point of silicon, is easily machinable, is available commercially in form suitable for making capillary dies in greater purity than silicon carbide, and is wetted adequately and in a stable manner by silicon. However, the use of graphite dies is limited by two not insignificant problems, namely, the formation of silicon carbide crystals at the die top as a consequence of the reaction of graphite and silicon and the introduction of impurities of a kind which reduce carrier lifetime or else create undesirable crystallographic defects. It is well established that silicon ribbons grown by EFG using graphite dies can have SiC particles at levels which are harmful to solar cell performance. Accordingly, the elimination of silicon carbide particles has been found to improve the yield of high efficiency (10-12%) solar cells obtainable from EFG ribbons. It is to be noted also that the presence of certain impurities in the silicon ribbon has an adverse effect on solar cell efficiency. While the presence of carbon, nitrogen and oxygen impurities is of almost insignificant consequence, since they are electrically inactive, other impurities present as solutes may have a deleterious effect on solar cell efficiency. Among impurities which have been found to occur in EFG-grown silicon ribbons and which are known to have an adverse effect on the electronic properties of silicon are iron, titanium, copper, zinconium, molybdenum, aluminum, maganese and copper, as well as silicon carbide. These impurities tend to be derived from the graphite dies, the melt-containing crucibles (which usually are fused quartz or graphite), the associated heat control members such as heaters and heat shields and insulators, and adjacent furnace components. These undesirable impurities tend to be distributed substantially uniformly throughout the silicon ribbon so as to reduce carrier lifetimes generally throughout the entire ribbon and thereby limit the possible conversion efficiency of solar cells, and also the total yield of relatively high efficiency solar cells, made from such ribbon.

Similar solute impurity problems are encountered in growing shaped crystalline bodies of other materials by the EFG process, e.g., sapphire.

Accordingly, the primary object of this invention is to improve upon the method of achieving shaped growth of crystalline bodies using capillary dies so as to manipulate the redistribution of selected impurities after they have segregated at the liquid/solid interface.

Another object is to provide an improved method of making solar cells based upon the EFG technique.

The foregoing objects are achieved by growing crystalline bodies by means of a capillary die which is made of a single material and has offset, i.e., vertically displaced, top end surfaces arranged so as to cause at least one specific impurity in the melt to appear preferentially at a selected region of the liquid/solid interface, thereby causing the impurity to appear as a solute asymmetrically distributed in the crystalline body in a predetermined and favorable distribution pattern. In the case of silicon ribbon grown from a graphite die, silicon carbide impurity is concentrated near one of the broad surfaces of the ribbon, thus leaving the other surface more pure for manufacture into higher quality solar cells.

Other objects, features and advantages of the invention are set forth in the following specific description of a preferred embodiment of the invention and the accompanying drawings wherein.

Figure 1:
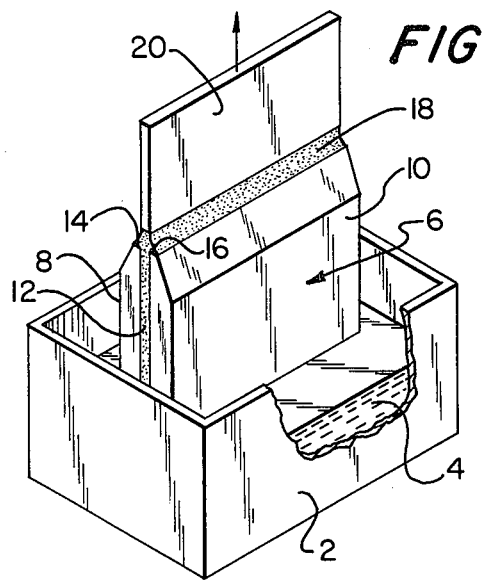
FIG. 1 is a perspective view of a conventional EFG die-crucible system for growing a ribbon.

The desireability of growing a silicon ribbon so that silicon carbide will precipitate preferentially at a selected part of the top end of the capillary die, whereby the particles of silicon carbide will be concentrated on one broad side of the ribbon, has been recognized in Japan Kokai (laid-open) Patent Specification Nos. 55483/78 and 55484/78 (application Ser. Nos. 129348 and 129349 respectively), of Naoaki Maki, both filed Oct. 29, 1976 and laid open May 19, 1978. In Kokai No. 55483/78 it is suggested that the silicon carbide particles in EFG silicon ribbon produce a non-uniform distribution of diffusion coefficient so that it is impossible to obtain a flat p-n junction by diffusion of a selected impurity. According to Kokai No. 55483/78, the net result of having a non-flat p-n junction is that the conversion efficiency varies over the length and breadth of the silicon body, it is impossible to obtain a desired power output, and the product has a current-voltage characteristic with a very high current leakage due to the presence of the silicon carbide particles. In Kokai No. 55483/78, a temperature imbalance is established by a temperature control member across the thickness dimension of the die top so that silicon carbide will precipitate only on the lower temperature side of the die. Kokai No. 55484/78 suggests a different approach which requires that a selected part of a two part die be made of silicon carbide and the remainder be made of carbon. Accordingly to Kokai No. 55484/78, the silicon carbide section of the die may be the same height as or extend above the adjacent carbon section, and the die may include a non-wetting protective member terminating the upper ends of the silicon carbide and carbon sections; however, with all such embodiments the silicon carbide particles tend to precipitate on the upper end of the silicon carbide section of the die, so that any silicon carbide occlusions in the grown crystal ribbon are concentrated at one side of the ribbon. The Kokai does not indicate which side of the ribbon has the occlusion, but is apparent that Maki believes that the asymmetric distribution of the silicon carbide in the silicon ribbon is attributable to gettering of the precipitated particles by the silicon carbide section of the die.

The present invention is based on the discovery that by lowering, i.e., vertically displacing, one of the two top surfaces of an all-graphite EFG ribbon die so as to obtain a deliberately created asymmetry it is possible to alter the shape and position of the growth interface, with growth being stabilized by a low meniscus at one face of the ribbon and a higher meniscus at the opposite face. Further changes in the shape of the growth interface may also be achieved by complementary asymmetries in the thermal environment surrounding the displaced die, such as die heaters, heat shields and thermal insulators. Manipulation of the growth interface to give asymmetric menisci has been found to be advantageous in that the silicon carbide particle density in a ribbon grown from such a displaced ribbon die is greatly reduced on the side of the ribbon growing from above the lower, or displaced, side of the die. This asymmetrical distribution of the silicon carbide tends to improve the overall quality of the ribbon material from the standpoint of its being suitable for making solar cells and correspondingly reduces the potential of the deleterious effect of SiC particles on solar cell quality. These advantages are preserved and utilized beneficially by forming the p-n junction at the relatively high purity side of the ribbon, with the solar cell formation being completed by adding the usual grid electrode to that same side of the ribbon and the usual back electrode to the opposite side of the ribbon. It is believed but not proven that it may be possible to redistribute other potentially harmful impurities which tend to appear as solutes in grown silicon bodies (e.g., metals such as iron, titanium, copper, zirconium and aluminum) so that they move preferentially toward the surface of the ribbon growing from the high side of the die, i.e., the side of the low meniscus.

Referring now to FIG. 1, a common EFG system for growing a silicon ribbon comprises a crucible 2 made of graphite or fused quartz and serving as a container for a reservoir supply of silicon melt 4, and a capillary die 6 made of graphite and having first and second plates 8 and 10 fixed in a predetermined mutual spaced relation so as to provide a narrow gap 12. The latter serves as a capillary whereby a narrow column of melt can rise between the plates. The upper ends of plates 8 and 10 are bevelled so as to provide relatively narrow flat end surfaces 14 and 16 respectively. Surfaces 14 and 16 are coplanar and horizontal and support a relatively thin melt film 18 which is connected to the column of melt between plates 8 and 10 and from which a silicon crystal ribbon 20 is grown. Ribbon 20 has a rectangular cross-section which is similar to the gross configuration of the upper end surfaces of plates 8 and 10 and the intervening space of the capillary and has a thickness which is a function of the height of melt film 18 and the curvatures of the meniscus at each long side of the film, i.e. the menisci seen when looking at a narrow end of the die. Although not shown it is to be understood that in the usual case the die further includes means for supporting the die in operative position in the crucible. Thus, as shown in U.S. Pat. Nos. 3,591,348 and 3,846,082, the die may include a supporting member at its base which rests on the crucible bottom or a supporting member at its top end which rests on an upper section of the crucible. The die also may form part of a crystal growth cartridge of the type shown in U.S. Pat. No. 4,118,197. In any event, the silicon ribbon 20 will be characterized by a significant concentration of SiC occlusions at both sides of the ribbon as a result of precipitation of silicon carbide produced by reaction of the silicon melt and the graphite die.

Figure 2:
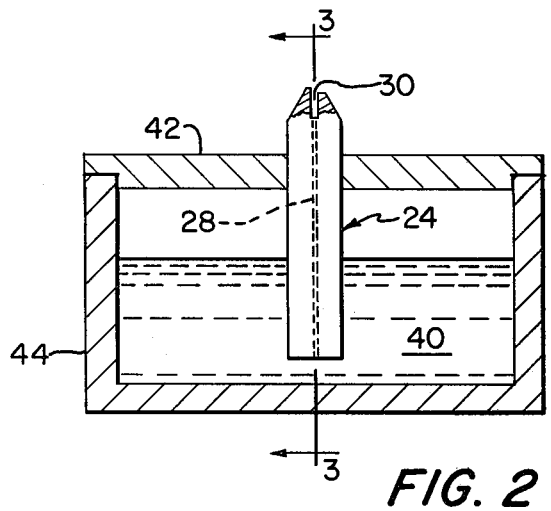
FIG. 2 is a cross-sectional view of a capillary die made in accordance with the invention.
Figure 3:
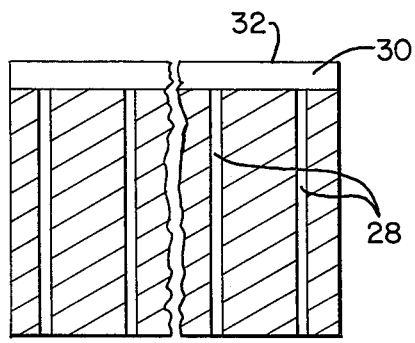
FIG. 3 is a sectional view taken along line 3—3 of FIG. 2.
Figure 4:
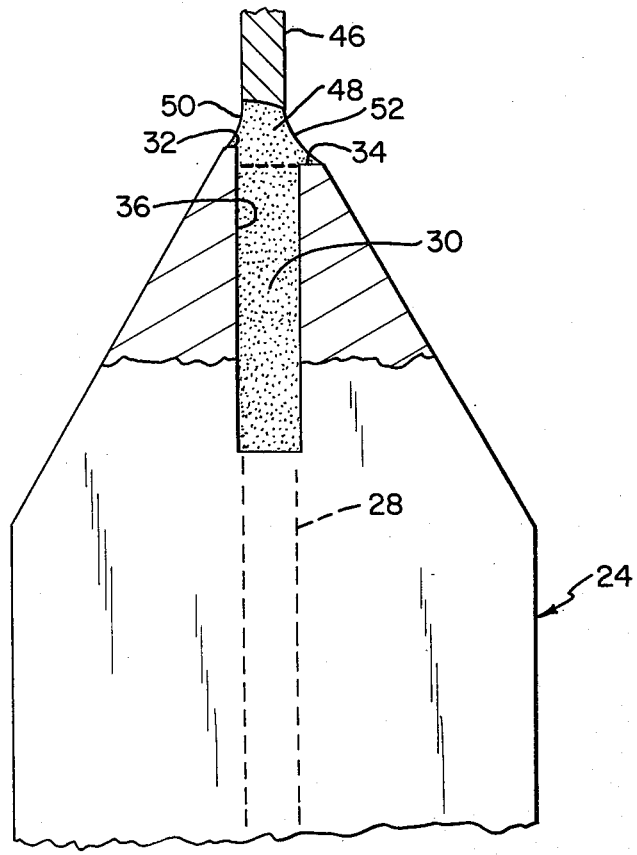
FIG. 4 is an enlarged schematic view illustrating crystal growth using the die of FIGS. 2 and 3.

Referring now to FIGS. 2, 3 and 4, a preferred form of EFG ribbon die embodying the present invention comprises a plate 24 made of graphite. The plate is formed with a plurality of vertically extending bores 28 of capillary dimensions and a horizontal top slot 30 which intersects the vertical capillaries and thereby serves as a top feed channel. The width of channel 30 (the horizontal dimension as seen in FIG. 2) is of capillary size. The upper end of the plate is bevelled as shown in FIG. 2 and in addition the upper end of plate 24 is cut back on one side of channel 30, thereby providing two relatively narrow upper end surfaces 32 and 34 (FIG. 4) which are vertically displaced one from the other. It has been found that with present equipment, in order to be able to sustain crystal growth of silicon ribbons with widths as great as 7.5 cm and thicknesses between about 0.01 and 0.05 cm, the surfaces 32 and 34 can be displaced from one another by no more than about 0.030 cm and preferably no more than about 0.012 cm. On the other hand, in order to achieve the desired asymmetrical redistribution of SiC, the surfaces 32 and 34 must be displaced from one another by at least 0.007 cm and preferably at least about 0.010 cm. The width of feed channel 30 is at least about 0.025 cm but preferably is about 0.050 cm when growing silicon ribbon with a thickness of between about 0.02 and 0.04 cm.

It is to be understood that the horizontal channel 30 may be omitted. In the latter event, the end surface 34 would extend across to the inner vertical surface 36 of the higher end of the die (in the manner suggested by the dotted line in FIG. 2) and would be intersected by the vertical capillaries. However, provision of channel 30 is preferred since it facilitates redistribution of impurities in the melt film.

The die of FIGS. 2 and 3 may be supported with its bottom end contained in a melt 40 in any suitable manner. Thus the die may be secured in a suitable opening in a graphite plate 42 which is supported by and serves as a cover plate for a crucible 44. Alternately the die may be attached to and join part of a crystal growth cartridge of the type shown in U.S. Pat. No. 4,118,197.

Referring now to FIG. 4, when the die of FIGS. 2 and 3 is employed to grow a silicon ribbon, melt fills the channels 28 and 30 by capillary section, and by appropriate heating and manipulation of a seed crystal 46, a film of melt as shown at 48 is formed between the seed crystal and the melt in channel 30. This melt film 48 is characterized by a relatively low meniscus 50 on the high side of the die and a relatively high meniscus 52 at the low side of the die. The low meniscus is so called since the liquid/solid growth interface at that side is closer to the die top surface 32 than it is to die top surface 34. As the crystal growth occurs on seed crystal 46 and the latter is pulled away from the die at a rate consistent with the rate of crystal growth, silicon carbide particles occur in the melt film 48 and appear preferentially at the side of the ribbon growing from above the low meniscus side of the growth interface. Consequently the silicon carbide particle density is drastically reduced on the side of the ribbon growing from the high meniscus side of melt film 48. This asymmetrical distribution of silicon carbide in the grown ribbon is attained without having to resort to any other modification of the apparatus employed in growing silicon ribbon from a symmetric die such as shown in FIG. 1, i.e. without having to resort to asymmetrical heating as disclosed by Kokai No. 55483/78 or a composite graphite/silicon carbide die as disclosed by Kokai No. 55484/78. Other impurities may be similarly redistributed as a result of the asymmetry of the die. Solutes such as boron which have substantially the same solubility in solid and liquid silicon are not redistributed significantly as a consequence of the asymmetry of the die.

Following is a specific example of the method of this invention based upon use of a ribbon die having top surfaces displaced in the manner of the die of FIGS. 2–4. The die was made from a single piece of graphite and measured 0.45 cm thick and 7.6 cm wide. Its upper end was bevelled symmetrically at its broad sides so that before formation of the displaced surface 34 the die body had a thickness of 0.075 cm at its top end surface. The top end surface 34 was formed at a height 0.012 cm below top end surface 32 and the feed channel 30 had a width and depth (the horizontal and vertical dimensions in FIG. 4) of 0.050 cm and 0.250 cm respectively. The capillary bores 28 had diameters of 0.075 cm and the overall height of the die measured from its upper end surface 32 to its bottom end surface was 1.538 cm. The die was mounted in a crystal growth cartridge of the type illustrated in U.S. Pat. No. 4,118,197. The cartridge was mounted in a horizontal furnace of the type shown in U.S. Pat. No. 4,118,197 together with a graphite crucible containing a supply of boron-doped silicon. The cartridge was disposed so that the lower end of the die was immersed in the melt, whereby the molten feed material rose to the top of the die by action of capillary rise. Heat was supplied to the die by energizing the electrical heaters forming part of the crystal growth cartridge so that the temperature of the die top was at about 10°–30° C. above the melting point of silicon and helium gas was fed into the cartridge at a rate of about 10 scfh continuously during crystal growth. Thereafter a seed crystal was lowered into the cartridge so as to make contact with the top of the die. The seed was kept in contact with the die long enough for its bottom end to melt and connect with the molten material at the upper end of the die. Thereafter, the crystal pulling mechanism was operated so as to cause the seed crystal to be pulled upwardly at a rate of between 3.0 and 3.5 cm/minute. As the seed crystal was pulled upwardly, a flat silicon ribbon measuring about 0.03 cm thick by about 7.5 cm wide was continuously formed on the seed. The resulting ribbon was cooled to room temperature after it passed out of the furnace enclosure. The formed ribbon was found to contain SiC particles but the particle density distribution was asymmetrical-the side of the ribbon grown from the low meniscus side of the melt film (i.e. the high side of the die) had a substantial concentration of SiC (1 to 10 particles per $cm^2$) while the opposite ribbon surface grown from the high meniscus side was virtually free of such particles and smooth in appearance. Solar cells were made from sections of the grown ribbon using the "pure" side (the one virtually free of SiC particles) as the junction side, with the junction having a depth in the order of 0.5 microns and being formed by diffusion. The junctions were made by diffusing phosphorus into the surface on the pure side of the ribbon from a silicon oxide layer deposited from a mixture of silane, oxygen, argon and phosphine. Suitable techniques for forming solar cell junctions by diffusion from oxide films are disclosed by A. W. Fisher et al, RCA Review, Vol. 29, No. 4, pp. 533-548, and 549-556. Other junction-forming techniques known to persons skilled in the art also may be used to form solar cells from crystalline bodies grown by use of dies made in accordance with this invention. Thereafter a grid electrode of a titanium/chromium/silver composition was applied to the junction side of the ribbon and a second back electrode of the same composition was applied to the opposite side of the ribbon. An antireflection (AR) coating was applied over the junction side of the ribbon after formation of the grid electrode. The resulting solar cells were found to have efficiencies of between 9% and 10.6% (AM1 and AR coated). In contrast solar cells made in the same manner from a section of the same ribbon using the opposite side of the ribbon as the junction side of the cells were poor, having efficiencies generally less than 5% (AM1 and AR coated).

As noted previously stable growth of silicon ribbons with thicknesses in the range of 0.01-0.05 cm and widths up to 7.5 cm using dies with top surface displacements of between about 0.007 and 0.030 cm can be achieved using cartridges as shown in U.S. Pat. No. 4,118,197 without any need to alter cartridge components so as to compensate thermally for die top asymmetry. The possibility exists that for growing thicker silicon ribbons, e.g., 0.08-0.11 cm thick, the displacement of the die top surfaces may be increased beyond 0.030 cm; however, no effort has been made to check out that possibility. It also appears that stable ribbon growth with a die top displacement of 0.012 to 0.030 cm can be achieved with ribbons of 3.5-4.0 cm width.

It is to be understood also that the displaced die may be made otherwise than as shown and described above. Thus, the die may be bevelled so that the surfaces 32 and 34 are made sufficiently narrow for the die to terminate in knife edges and the several capillaries 28 may be replaced by a single wide capillary. Also the displaced die could be made in two pieces as disclosed by Ravi, supra; however, two-piece dies are not advantageous when the ribbons to be grown have a width in excess of about 1.5 cm due to the tendency of the die to come apart under the force of silicon carbide particles precipitating between the two die parts. Another possible modification includes making the upper end surfaces 32 and 34 with a curvature (concave or convex) along the width of the die, i.e., the horizontal dimension of the die as seen in FIG. 3, for the purpose of modifying the shape of the crystallization front. A further possible modification is to form the die so that in plan view it appears to have bulbous ends, that is, the combined edge configuration of the die top surfaces 32 and 34 corresponds to the profile of a relatively thin flat plate terminating in enlarged and rounded edge sections. The invention also may be used in growing undoped silicon ribbon or silicon bodies of other cross-sectional shapes. Thus, for example, silicon tubes with a circular or other cross-sectional shapes may be grown using a capillary die comprising two concentric members with a capillary between them and with the upper end of either member being displaced below the corresponding end of the other member. For making tubular silicon solar cells as disclosed by U.S. Pat. No. Re. 29,833, the upper end of the inner concentric die member preferably would project above the outer concentric member, so that silicon carbide particles would tend to be concentrated at the inner surface of the grown tubes.

Also the same principle of a displaced die may be used in growing other crystalline materials where dissolved die materials or other materials are known to precipitate in the grown crystal, e.g., in growing sapphire ribbons using molybdenum EFG dies where, as noted in U.S. Pat. No. 3,953,174, molybdenum occlusions are known to occur in EFG grown sapphire. By this invention an asymmetric distribution of a precipitated impurity can be achieved without resorting to the necessity of using a capillary die made of two materials and without having to use a specially asymmetrically designed or positioned thermal control member as required by Kokai Nos. 55483/78 and 55484/78. Other possible modifications and advantages of the invention will be obvious to persons skilled in the art.

As used in the following claims, the term "die body" is to be construed as consisting of a single piece or made up of two or more pieces like dies shown in U.S. Pat. Nos. 3,591,348 and 3,687,633, and as referring to the portion(s) of the die which define the capillary and its upper end film-supporting surfaces.

What is claimed is:

1. Apparatus for use in growing a crystalline body of silicon from a melt so that silicon carbide precipitating from the melt will be distributed asymmetrically in the crystalline body, said apparatus comprising a crucible made of graphite or quartz and formed with a closed bottom end and an open top end, and a capillary die having a die body made solely of graphite and characterized by an upper end, a lower end and a capillary, said upper end comprising first and second end surfaces spaced from one another so as to provide an opening for said capillary, said first end surface being located at a greater distance from said lower end than said second end surface, and means for supporting said die so that said lower end projects into the crucible in position to be immersed in a silicon melt contained in the crucible, whereby when a crystalline body of silicon is grown from a film of melt which is supported by said end surfaces and replenished via said capillary, said film will have a first meniscus extending between said die body and said first end surface and a second meniscus extending between said die body and said second end surface, with said second meniscus being longer and extending lower than said first meniscus.

2. Apparatus according to claim 1 wherein said die body has a width dimension and a thickness dimension, and said first and second end surfaces are coextensive along said width dimension and are spaced from one another along said thickness dimension, and further wherein said die body is bevelled at said upper end so that its thickness at said upper end is less than its thickness immediately below said upper end.

3. Apparatus according to claim 1 wherein said die body is tapered in at least one dimension at said upper end so that the area of its cross-section at said upper end is substantially less than the area of its cross-section immediately below said upper end.

4. Apparatus according to claim 2 wherein at said upper end said width dimension is substantially greater than said thickness dimension.

5. Apparatus according to claim 3 wherein at said upper end the cross-sectional configuration of said die body is rectangular.

6. Apparatus according to claim 5 wherein said crucible is made of graphite.

7. Apparatus according to claim 5 wherein said first end surface is located between 0.007 and 0.030 cm. above said second end surface.

8. Apparatus according to claim 7 wherein said crucible is made of graphite.

9. Apparatus according to claim 5 wherein said first end surface is located between 0.012 and 0.030 cm. above said second end surface.

* * * * *